United States Patent [19]
Dumas

[11] 3,956,672
[45] May 11, 1976

[54] IN LINE RECTIFIER ASSEMBLY

[75] Inventor: Christ J. Dumas, Forest View, Ill.

[73] Assignee: American Plasticraft Company, Chicago, Ill.

[22] Filed: Aug. 1, 1975

[21] Appl. No.: 601,211

Related U.S. Application Data

[63] Continuation of Ser. No. 450,598, March 13, 1974, abandoned.

[52] U.S. Cl. ............................. 317/99; 317/120; 357/72; 321/11; 174/52 PE
[51] Int. Cl.² ........................................ H01L 23/02
[58] Field of Search ............ 338/48, 252, 260, 295, 338/320; 174/52 PE; 317/99, 103, 100, 101 R, 120, 256; 248/27; 310/68 D; 321/8 R, 11; 220/3.5, 3.6; 357/72, 74, 76, 77

[56] References Cited
UNITED STATES PATENTS

| | | | |
|---|---|---|---|
| 2,466,211 | 4/1949 | Crockett | 201/63 |
| 2,979,645 | 4/1961 | Maiden | 317/234 |
| 3,571,650 | 3/1971 | Hofmeister | 313/317 |

Primary Examiner—Gerald P. Tolin
Attorney, Agent, or Firm—Leo J. Aubel

[57] ABSTRACT

A self-mountable, self-contained and encapsulated rectifier assembly operative to provide a high D.C. voltage at low current while minimizing arcing, corona and other disruptive electrical phenomena.

1 Claim, 7 Drawing Figures

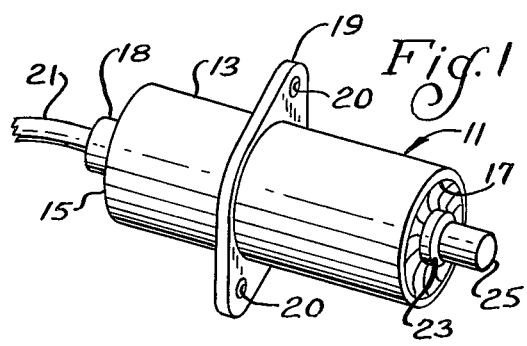
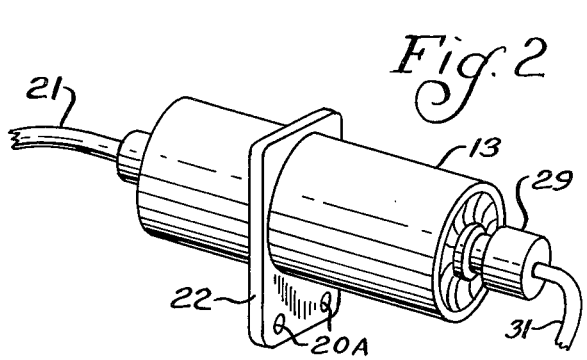
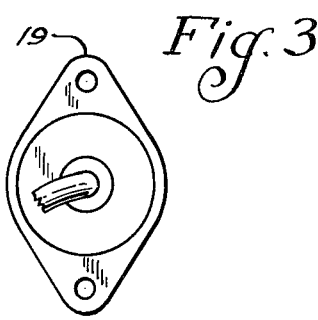
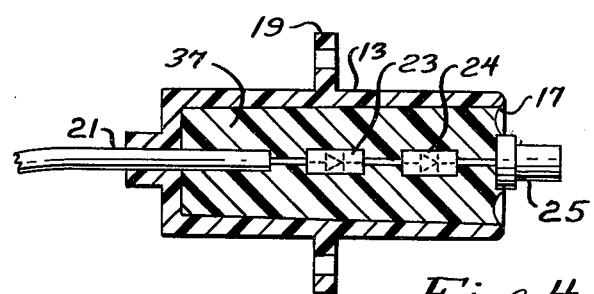
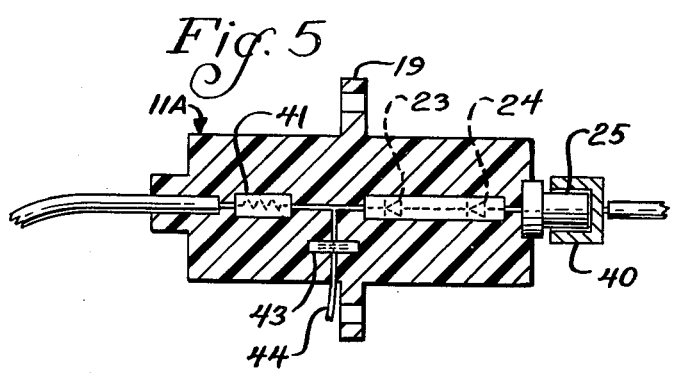
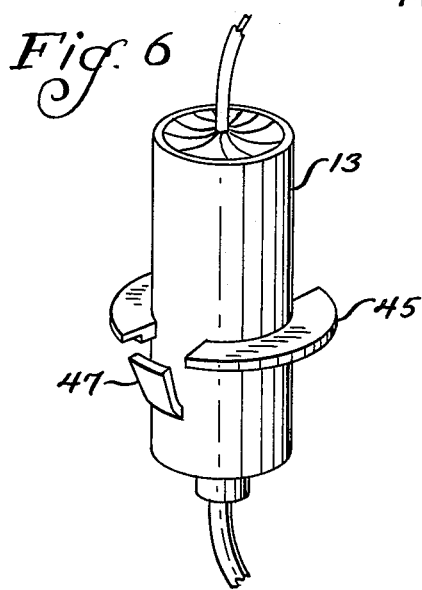
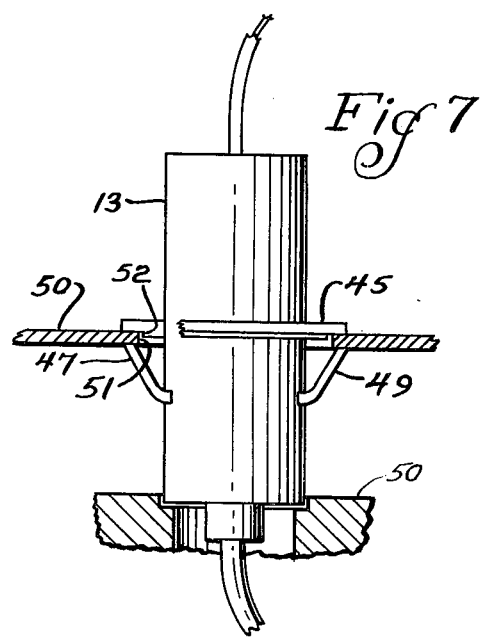

IN LINE RECTIFIER ASSEMBLY

This is a continuation of application Ser. No. 450,598, filed Mar. 13, 1974, and now abandoned.

BACKGROUND OF THE INVENTION

There are many environments wherein a small compact assembly is desirable. Such high voltage rectifier assemblies should prevent electrical discharge between component parts and should include means for minimizing corona discharge and ozone problems. An example therein is as the assembly to provide a high D.C. voltage, in the range of 8 kv to 35 kv to the focus anode of a TV picture tube.

In various prior art electronic high voltage supplies, the so-called stick rectifier assembly consists of a single solid state rectifier usually in the form of an elongated member with connecting lead wires at either end. As is known, one terminal connects to an A.C. input and the other end connects to the high voltage electrode of the electronic device, for example, a TV picture tube. Prior art stick rectifiers are generally inexpensive; however, the means for mounting the rectifiers in suitable sockets and the means for mounting the socket on the associated chassis requires additional hardware and labor. In certain types of prior art stick rectifier assemblies, the rectifier connects to lead wires and insulative concentric tubing usually of the heat shrinkable type surrounds the lead wires. Preferably several layers of tubing were utilized to provide good dielectric barriers. The assemblies are commonly suspended in spaced relation from ground and lower voltage reference points, such as an associated metal casing, to thereby minimize corona or high voltage breakdown.

Heretofore, in order to reduce expense and hardware, wire leads have been used to make electrical connections as well as for mechanically supporting the rectifier therebetween. The foregoing causes problems, since the rectifier is not securely positioned and any mechanical shift can cause the rectifier to move adjacent to electrical ground, thereby tending to cause high voltage breakdown, ozone problems and other unwanted effects. Transients caused by the foregoing can be radiated into the associated electrical circuits, causing operating and performance problems.

In accordance with the present invention, a rectifier assembly is provided having an improved dielectric spacing between active components while providing good secure positioning of the rectifier assembly for minimizing the problems of high voltage breakdown, corona and ozone. The inventive rectifier assembly is a self-contained, self-mountable unit with high voltage input and output leads. The inventive assembly includes mounting means which are part of the assembly and which are suitably insulated.

The inventive rectifier assembly includes a casing for mounting the components such as the rectifiers, resistors, capacitors and inductors internally thereof. The resistors, for example, can be encapsulated within the casing in series with the input and output leads to provide a low corona connection.

Also, the inventive assembly can be manufactured by insert molding or transfer molding techniques; that is, the components can be initially assembled and then encapsulated by transfer or insert molding techniques.

It is a principal object of the present invention to provide a small, compact, self-mountable, and encapsulated rectifier assembly having an improved high voltage breakdown characteristic.

It is another object of the present invention to provide a small, self-mountable, compact and encapsulated, high voltage rectifier assembly capable of rectifying voltages in the 8 to 35 kv range.

It is still another object of the present invention to provide a high voltage rectifier assembly having uniform high voltage gradient stress throughout the rectifier assembly.

It is another object of the present invention to provide a high voltage rectifier assembly with active or passive components such as diodes, resistors and capacitor mounted in a case and comprising a unitary structure.

It is another object of the present invention to provide a high voltage rectifier assembly providing an improved mechanical mounting means, and improved electrical characteristics for the overall assembly.

The foregoing and other objects, features and advantages of the present invention will be apparent from the following more particular description of preferred embodiments of the invention, as illustrated in the accompanying drawings wherein:

DESCRIPTION OF THE DRAWINGS

FIG. 1 is an isometric view of a rectifier assembly in accordance with the invention;

FIG. 2 is an isometric view of a rectifier assembly showing a connector for connecting electrically to the focus anode of a television picture tube;

FIG. 3 is an end view of FIG. 1;

FIG. 4 is a view partly in cross section of the structure of FIG. 1, and showing in electrical schematic form, the rectifiers mounted within the assembly casing;

FIG. 5 is a cross sectional view of another embodiment of the invention wherein capacitor and resistor components are mounted within the assembly casing;

FIG. 6 is an isometric view of the inventive assembly having a pluggable or insertable mounting means; and FIG. 7 is a plan view showing an assembly of FIG. 6 in a mounted position.

DESCRIPTION OF THE INVENTION

FIG. 1 shows the inventive rectifier assembly 11 including case, casing or housing 13 formed as a can-like container preferably of a relatively high density plastic. Casing 13 is closed at one end 15 and open at its other end 17. A mounting flange 19 has suitable mounting holes 20 to enable the assembly 11 to be mounted in position on a suitable bracket or board. The closed end of the casing 13 includes an extending lug 18 to provide additional shielding and strain relief for the lead 21 connecting to the rectifier assembly 11.

Referring now also to FIGS. 2 and 4, a rectifier diode 23 is positioned within the casing 13 and an electrical connection made from lead 21 to one electrode of the rectifier 23 and the other eltcrode of the rectifier 23 is connected in series to a second rectifier 24. Rectifier 24 connects to a suitable cylindrical terminal 25. In operation, A.C. input cap 29 is snapped over terminal 25 substantially to shoulder 23 on terminal 25 to make a good electrical connection. Lead 21 connects to the anode of the associated picture tube, not shown.

In assembly, one or more rectifier diodes 23 and 24 (indicated schematically in FIG. 4) are mounted concentrically along the axis of the casing 13. Note that as shown in FIG. 5, the rectifier diodes 23 and 24 may be poled in either direction. Also, the rectifier diodes of either FIG. 4 or 5 can be mounted or formed in a single block as indicated in FIG. 5. The encapsulating or potting compound 37, of any known suitable dielectric, is then poured through the open end 17 of the casing 13 and allowed to solidify. The encapsulating compound 37 thus securely mounts the rectifier diodes 23 and 24 in concentric axial relation within the casing 13. Note that casing could likewise be square or rectangular in cross section, and the rectifier diodes would be mounted in the cross section center.

FIG. 2 also shows a square mounting flange 22 for the casing 13 and includes mounting holes 20A positioned on one side of the mounting flange 22 to permit mounting casing 13 such as along the side of a chassis.

FIG. 5 shows another embodiment of the inventive assembly 11A wherein the assembly 11A is formed with the casing and the encapsulating compound being of the same material. Also, in FIG. 5, in addition to the rectifier diodes 23 and 24, a resistor 41 may be mounted in series with the diodes; and, a capacitor 43 may be mounted to have one plate connected to the junction of resistor 41 and diode 35, and the other plate of capacitor 43 may connect externally of assembly 11A through a suitable lead 44. In FIG. 5, diodes 23 and 24 are connected in series with the anode of the diode 23 connected to lead 19, and the cathode of the diode 24 connected to the cap or terminal 25 to thereby provide a relatively negative voltage through lead 31 and contacts 33 to the anode. In the structure of FIG. 5, the various components may be initially assembled and positioned, and the entire assembly molded by insert or transfer molding techniques as one compositely housed assembly. Also as shown in FIG. 5, the metal cap 25 can be directly mounted in an associated electrical mounting receptacle indicated generally as 40.

FIG. 6 shows another embodiment of the invention showing a mounting flange 45 comprising a pair of semi-circular members formed around the periphery of the casing 13 and extending normally to the surface of case 11.

A basic advantage of the structure of FIG. 6 is that the case 11 can be snapped or plugged into position. For this purpose, snap-in flexible lugs 47 and 49 are formed in spaced circumferential position to extend outwardly and at an angle with respect to the surface of the case 11 and to cooperate with an outwardly extending flange 45. The lugs 47 and 49 extend outwardly to approximately the same diametrical dimension as the edge of the flange 45. As seen in FIG. 7, the upper edges of the lugs 47 and 49 are cut along a horizontal line to thereby accommodate and fit snuggly against the bottom surface of the associated mounting panel 50; and, with the bottom surface of the flange 45 fitting against the top of the panel 50. Flange 45 is notched along its lower peripheral surface as at 52 to accommodate or fit within the opening 51 in the panel 50, to thereby secure the casing from sideward movement. Additionally, a lower support 55 can accommodate the lower end of casing 13.

While the invention has been particularly described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A high voltage rectifier assembly comprising, in combination, an elongated cup-like casing of dielectric material, said casing having an open end and a covered end, the covered end having a hole, encapsulating compound in said casing, solid state components positioned in spaced linear relation substantially along the longitudinally axis of said casing, an electrical lead extending through said hole and electrically coupling to said components, an electrical cap terminal positioned adjacent the open end of said casing and electrically coupling to said components for enabling a snap over electrical connection to be made to said assembly, said encapsulating compound retaining said lead, said components and said terminal in said casing, and a mounting flange substantially encircling said casing transverse to the axis of the casing for mounting said rectifier assembly directly on the associated chassis, wherein there is an opening on the side of said cup-like casing and wherein a capacitor having two terminals is mounted in said casing;

on of said terminals being electrically connected to said solid state components, and the other terminal extending through said opening for connection externally of the casing.

* * * * *